(12) United States Patent
Miyazaki et al.

(10) Patent No.: US 10,677,754 B2
(45) Date of Patent: Jun. 9, 2020

(54) MAGNETIC BODY DETECTION DEVICE, PROGRAM FOR CAUSING COMPUTER TO PERFORM MAGNETIC BODY DETECTION FUNCTION, AND COMPUTER-READABLE RECORDING MEDIUM FOR RECORDING PROGRAM

(71) Applicant: FUJIDENOLO CO., LTD., Komaki-shi, Aichi (JP)

(72) Inventors: Hideki Miyazaki, Komaki (JP); Toshitaka Fujioka, Komaki (JP); Akari Sakuragi, Komaki (JP)

(73) Assignee: FUJIDENOLO CO., LTD., Komaki-shi (JP)

( * ) Notice: Subject to any disclaimer, the term of this patent is extended or adjusted under 35 U.S.C. 154(b) by 43 days.

(21) Appl. No.: 16/306,826

(22) PCT Filed: Mar. 29, 2018

(86) PCT No.: PCT/JP2018/013499
§ 371 (c)(1),
(2) Date: Dec. 3, 2018

(87) PCT Pub. No.: WO2018/181836
PCT Pub. Date: Oct. 4, 2018

(65) Prior Publication Data
US 2019/0257789 A1      Aug. 22, 2019

(30) Foreign Application Priority Data

Mar. 30, 2017   (WO) .................. PCT/JP2017/013334

(51) Int. Cl.
*G01N 27/72*      (2006.01)
*G01R 33/12*      (2006.01)
(Continued)

(52) U.S. Cl.
CPC ............ *G01N 27/72* (2013.01); *G01R 33/028* (2013.01); *G01R 33/093* (2013.01); *G01R 33/12* (2013.01);
(Continued)

(58) Field of Classification Search
CPC ... B29C 66/71; B29C 66/7212; B29C 65/483; B29C 65/5021; G01R 33/028; G01R 33/12; G01R 33/1223; G01R 33/093
(Continued)

(56) References Cited

U.S. PATENT DOCUMENTS 5,748,108 A      5/1998   Sampey et al.
2006/0043963 A1*  3/2006   Kaneyasu .............. G01D 3/036
                                                    324/179

(Continued)

FOREIGN PATENT DOCUMENTS

JP      H10-208187 A      8/1998
JP      2003-187381 A     7/2003
(Continued)

OTHER PUBLICATIONS

May 16, 2017 Search Report issued in Interntional Patent Application PCT/JP2017/013334.
(Continued)

*Primary Examiner* — Raul J Rios Russo
(74) *Attorney, Agent, or Firm* — Oliff PLC

(57) ABSTRACT

In a magnetic material detection device comprising: at least two magnetic sensors; and a control device detecting a magnetic material by using output values of the magnetic sensors, the magnetic sensors are arranged at an interval of a predetermined distance from each other such that a subject is located outside a space therebetween, and the control device detects the magnetic material by comparing time change amounts of output values of the magnetic sensors (Continued)

resulting from a change in relative position between the subject and each of the magnetic sensors, with utilizing that an absolute value of the time change amount becomes larger in one of the magnetic sensors close to the subject as compared to another of the magnetic sensors far from the subject.

12 Claims, 11 Drawing Sheets

(51) Int. Cl.
G01R 33/028 (2006.01)
G01R 33/09 (2006.01)
B29C 65/00 (2006.01)
B29C 65/48 (2006.01)
B29C 65/50 (2006.01)

(52) U.S. Cl.
CPC ........ *G01R 33/1223* (2013.01); *B29C 65/483* (2013.01); *B29C 65/5021* (2013.01); *B29C 66/71* (2013.01); *B29C 66/7212* (2013.01)

(58) Field of Classification Search
USPC ... 324/51, 55, 200, 219, 229, 233, 239, 254, 324/257, 260
See application file for complete search history.

(56) References Cited

U.S. PATENT DOCUMENTS

| 2007/0052411 | A1 | 3/2007 | McClure et al. |
| 2018/0283904 | A1* | 10/2018 | Yamamoto ............. G01R 33/02 |
| 2019/0094043 | A1* | 3/2019 | Miyazaki ........... G01R 33/0206 |

FOREIGN PATENT DOCUMENTS

| JP | 2003-294704 A | 10/2003 |
| JP | 2006-071347 A | 3/2006 |
| JP | 2008-026192 A | 2/2008 |
| JP | 2016-130711 A | 7/2016 |

OTHER PUBLICATIONS

May 16, 2017 Written Opinion issued in Interntional Patent Application PCT/JP2017/013334.
May 22, 2018 Search Report issued in Interntional Patent Application PCT/JP2018/013499.
May 22, 2018 Written Opinion issued in Interntional Patent Application PCT/JP2018/013499.

* cited by examiner

MAGNETIC BODY DETECTION DEVICE, PROGRAM FOR CAUSING COMPUTER TO PERFORM MAGNETIC BODY DETECTION FUNCTION, AND COMPUTER-READABLE RECORDING MEDIUM FOR RECORDING PROGRAM

TECHNICAL FIELD

The present invention relates to a technique of detecting a magnetic material by using output values of two magnetic sensors.

BACKGROUND ART

A technique of detecting a magnetic material by using at least two magnetic sensors and output values of the magnetic sensors is well known. For example, this corresponds to techniques described in Patent Documents 1, 2. In a magnetic material detection device disclosed in Patent Document 1, two magnetic sensors are disposed between which a movement path of a subject is, and signals from the magnetic sensors are arithmetically operated such that an output signal for magnetic noise is minimized so as to determine whether the subject is a magnetic material based on an arithmetic operation result. A portable magnetic detector disclosed in Patent Document 2 includes a housing, two magnetic sensors that are a detection sensor and a geomagnetism component compensation sensor disposed in the housing, and a position detecting portion disposed in the housing and detecting positions of the magnetic sensors, and outputs position data of the magnetic sensors and magnetic data of the magnetic sensors associated with a data processing device disposed outside the housing.

PRIOR ART DOCUMENTS

Patent Documents

Patent Document 1: Japanese Laid-Open Patent Publication No. 2003-294704
Patent Document 2: Japanese Laid-Open Patent Publication No. 2016-130711

SUMMARY OF THE INVENTION

Problem to be Solved by the Invention

As described in Patent Document 1, by using output values of the two magnetic sensors, a magnetic material can be detected with an environmental magnetic field taken into consideration. However, if the output values of the two magnetic sensors have individual variations, a difference of the output values of the two magnetic sensors does not become zero even when no magnetic material is present. Therefore, when a magnetic material is detected by directly using the output values of the two magnetic sensors, a detection accuracy of a magnetic material may be reduced (e.g., detection of a small magnetic material may become difficult).

The present invention was conceived in view of the situations and it is therefore an object of the present invention to provide a magnetic material detection device, a computer program for driving a computer to implement a magnetic material detection function, and a computer readable recording medium recording the program, which can improve detection accuracy of a magnetic material when the magnetic material is detected by using output values of two magnetic sensors.

Solution to Problem

To achieve the above object, a first aspect of the present invention provides a magnetic material detection device comprising: (a) at least two magnetic sensors; and a control device detecting a magnetic material by using output values of the magnetic sensors, wherein (b) the magnetic sensors are arranged at an interval of a predetermined distance from each other such that a subject is located outside a space therebetween, and wherein (c) the control device detects the magnetic material by using time change amounts of output values of the magnetic sensors resulting from a change in relative position between the subject and each of the magnetic sensors.

A second aspect of the present invention provides the magnetic material detection device recited in the first aspect of the invention, wherein the magnetic sensors are vector-type magnetic sensors having a magnetically sensitive direction and the magnetic material detection device includes two magnetic sensors having the same magnetically sensitive direction, and wherein the control device detects the magnetic material by using time change amounts of output values of the two magnetic sensors having the same magnetically sensitive direction.

A third aspect of the present invention provides the magnetic material detection device recited in the first or second aspect of the invention, wherein the control device detects the magnetic material by using a difference in time change amounts of output values of the magnetic sensors.

A fourth aspect of the present invention provides the magnetic material detection device recited in any one of the first to third aspects of the invention, wherein when the magnetic material is detected, the control device calculates a distance between the magnetic material and the magnetic sensors as well as a strength of a magnetic moment of the magnetic material by using output value change amounts from an immediately preceding timing of the magnetic sensors obtained by subtracting output values of the magnetic sensors acquired immediately before a first detection of the magnetic material from the latest output values of the magnetic sensors, respectively.

A fifth aspect of the present invention provides the magnetic material detection device recited in the fourth aspect of the invention, wherein when the magnetic material is detected, the control device determines whether the detected magnetic material has become more distant from the magnetic sensors based on whether a ratio of the output value change amount to a maximum value of the output value change amounts has become less than a predetermined ratio.

A sixth aspect of the present invention provides the magnetic material detection device recited in any one of the first to third aspects of the invention, wherein when the magnetic material is detected, the magnetic material detecting portion establishes a magnetic material detection mode, and the control device cancels the magnetic material detection mode when a ratio of an output value change amount from an immediately preceding timing in one of the magnetic sensors to a maximum value of the output value change amount is less than a predetermined ratio, wherein the output value change amount from the immediately preceding timing is obtained by subtracting an output value of the magnetic sensor acquired immediately before a first detection of the magnetic material from the latest output value of the magnetic sensor during the magnetic material detection mode is established.

A seventh aspect of the present invention provides the magnetic material detection device recited in any one of the first to sixth aspects of the invention, wherein the control device calculates the time change amounts of the output values of the two magnetic sensors in time intervals of the same length starting from the same time point for each of multiple time intervals having different lengths respectively and detects the magnetic material by using the time change amounts in the time intervals of the same length.

An eighth aspect of the present invention provides a program (a) for causing a computer to implement a magnetic material detection function of detecting a magnetic material by using output values of at least two magnetic sensors, wherein (b) in the magnetic material detection function, the magnetic material is detected by using time change amounts of output values of the at least two magnetic sensors arranged at an interval of a predetermined distance from each other such that a subject is located outside a space therebetween, and wherein the time change amounts result from a change in relative position between each of the magnetic sensors and the subject.

A ninth aspect of the present invention provides a computer-readable recording medium (a) recording a program for causing a computer to implement a magnetic material detection function of detecting a magnetic material by using output values of at least two magnetic sensors, wherein (b) in the magnetic material detection function, the magnetic material is detected by using time change amounts of output values of the at least two magnetic sensors arranged at an interval of a predetermined distance from each other such that a subject is located outside a space therebetween, and wherein the time change amounts result from a change in relative position between each of the magnetic sensors and the subject.

Advantageous Effects of Invention

According to the magnetic material detection device recited in the first aspect of the invention, the magnetic material is detected by using the time change amounts of the output values of the two magnetic sensors resulting from the change in relative position between the subject and the magnetic sensors which are arranged at a mutual interval of the predetermined distance with the subject positioned outside a space therebetween. Therefore, the magnetic material can be detected while an influence of a change in the geomagnetism on the magnetic sensors is eliminated as much as possible. Specifically, in an environment magnetic field in which the magnetic material does not exist near the magnetic sensors, the time change amounts of the output values of the two magnetic sensors have substantially the same values, whereas in such a situation that the magnetic sensors approach the magnetic material, the absolute value of the time change amount becomes larger in the magnetic sensor close to the magnetic material as compared to the magnetic sensor far from the magnetic material. By using such a phenomenon, the magnetic material can be detected while an influence of a change in the geomagnetism on the magnetic sensors is eliminated as much as possible. Therefore, when the magnetic material is detected by using the output values of the two magnetic sensors, the detection accuracy of the magnetic material can be improved.

According to the magnetic material detection device recited in the second aspect of the invention, since the magnetic material is detected by using the time change amounts of the output values of the two vector-type magnetic sensors having the same magnetically sensitive directions, the magnetic material can properly be detected.

According to the magnetic material detection device recited in the third aspect of the invention, the magnetic material is detected by using the difference between the time change amounts of the output values of the two magnetic sensors, and therefore, by utilizing the phenomenon as described above, the magnetic material can be detected while an influence of a change in the geomagnetism on the magnetic sensors is eliminated as much as possible.

According to the magnetic material detection device recited in the fourth aspect of the invention, when the magnetic material is detected, the distance between the magnetic material and the magnetic sensor as well as the strength of the magnetic moment of the magnetic material are calculated by using the output value change amounts from the immediately preceding timing in the two magnetic sensors obtained by subtracting the output value of the magnetic sensor acquired immediately before a first detection of the magnetic material from the latest output value of the magnetic sensor. Therefore, even if no change is made in relative position between the magnetic material and the magnetic sensors (i.e., even if the time change amount of the output values of the magnetic sensor is zero) at the time of detection of the magnetic material, the distance between the magnetic material and the magnetic sensor as well as the strength of the magnetic moment of the magnetic material can be calculated. In this case, since the output value change amounts are used, where the output value change amounts are obtained by subtracting the output value of the magnetic sensor, and the output value is attributed from the geomagnetism which affects exclusively the magnetic sensor immediately before the detection of the magnetic material, the influence of the geomagnetism on the magnetic sensor can be eliminated as much as possible.

According to the magnetic material detection device recited in the fifth aspect of the invention, when the magnetic material is detected, it is determined whether the detected magnetic material has become more distant from the magnetic sensor based on whether a ratio of the output value change amount to the maximum value of the output value change amounts has become less than the predetermined ratio, and therefore it is properly determined that the magnetic material and the magnetic sensor are moved away from each other after the magnetic material is detected.

According to the magnetic material detection device recited in the sixth aspect of the invention, when the magnetic material is detected, the magnetic material detection mode is established, and when a ratio of the output value change amount to a maximum value of the output value change amounts is less than the predetermined ratio while the magnetic material detection mode is established, the magnetic material detection mode is canceled, and therefore, the magnetic material detection mode can properly be canceled after the magnetic material detection mode is established.

According to the magnetic material detection device recited in the seventh aspect of the invention, the time change amounts of the output values of the two magnetic sensors in time intervals of the same length starting from the same time point are respectively calculated for each of multiple time intervals having different lengths, and the magnetic material is detected by using the time change amounts in the time intervals of the same length, so that the time change amounts are properly calculated according to a difference in operation speed during operation of the magnetic material detection device by an operator, which enables a further improvement in the detection accuracy of the magnetic material.

According to the program recited in the eighth aspect of the invention, the magnetic material is detected by using the time change amounts of the output values of the at least two magnetic sensors resulting from the change in relative position between the subject and the magnetic sensors which are arranged at a mutual interval of the predetermined distance with the subject positioned outside a space therebetween. By using such a phenomenon, the magnetic material can be detected while an influence of a change in the geomagnetism on the magnetic sensors is eliminated as much as possible. Therefore, when the magnetic material is detected by using the output values of the two magnetic sensors, the detection accuracy of the magnetic material can be improved.

According to the computer-readable recording medium recited in the ninth aspect of the invention, the magnetic material is detected by using the time change amounts of the output values of the at least two magnetic sensors resulting from the change in relative position between the subject and the magnetic sensors which are arranged at a mutual interval of the predetermined distance with the subject positioned outside a space therebetween. By using such a phenomenon, the magnetic material can be detected while an influence of a change in the geomagnetism on the magnetic sensors is eliminated as much as possible. Therefore, when the magnetic material is detected by using the output values of the two magnetic sensors, the detection accuracy of the magnetic material can be improved.

MODES FOR CARRYING OUT THE INVENTION

Examples of the present invention will now be described in detail with reference to the drawings.

First Example

Figure 1:
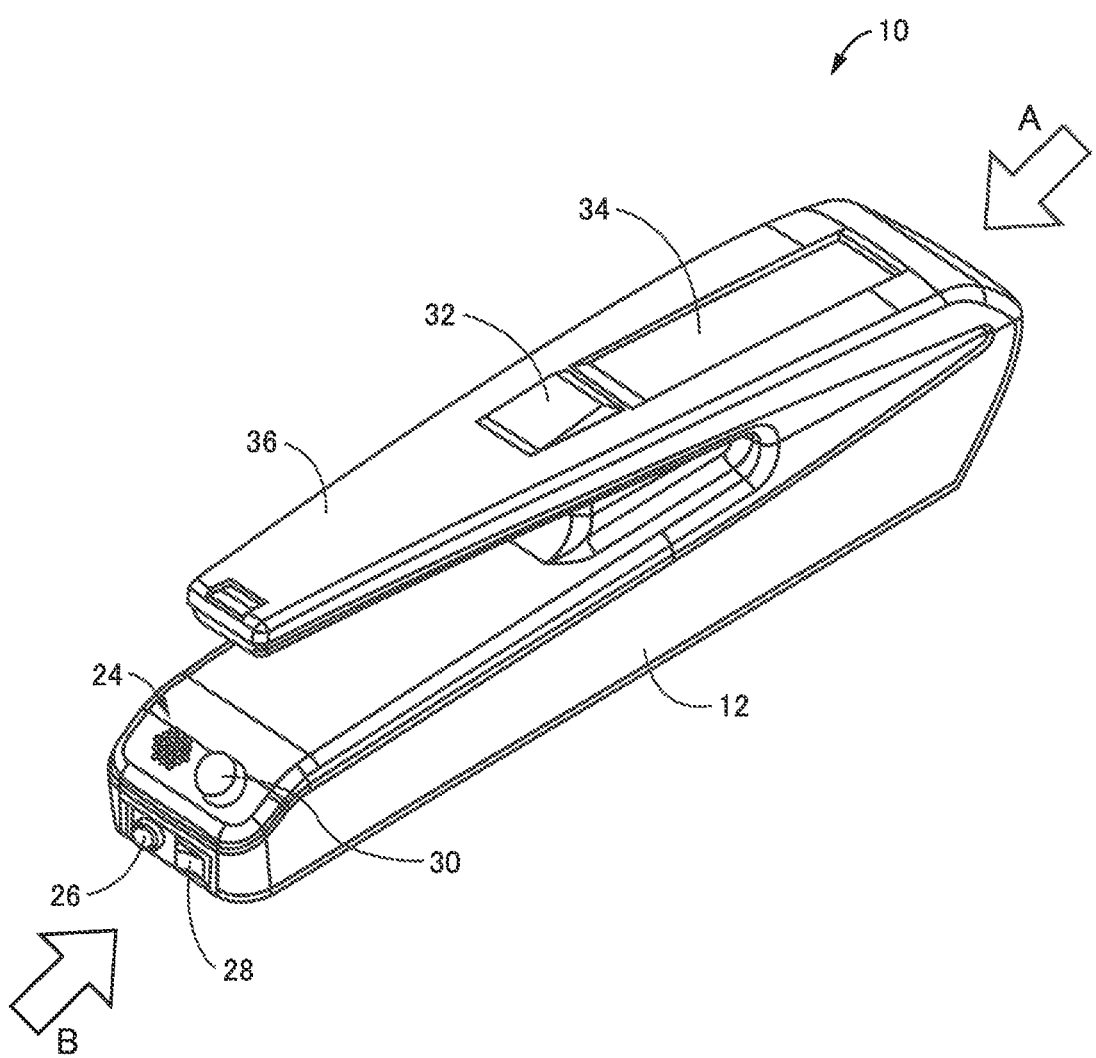
FIG. 1 is an external view of an example of a magnetic material detection device to which the present invention is applied.
Figure 2:
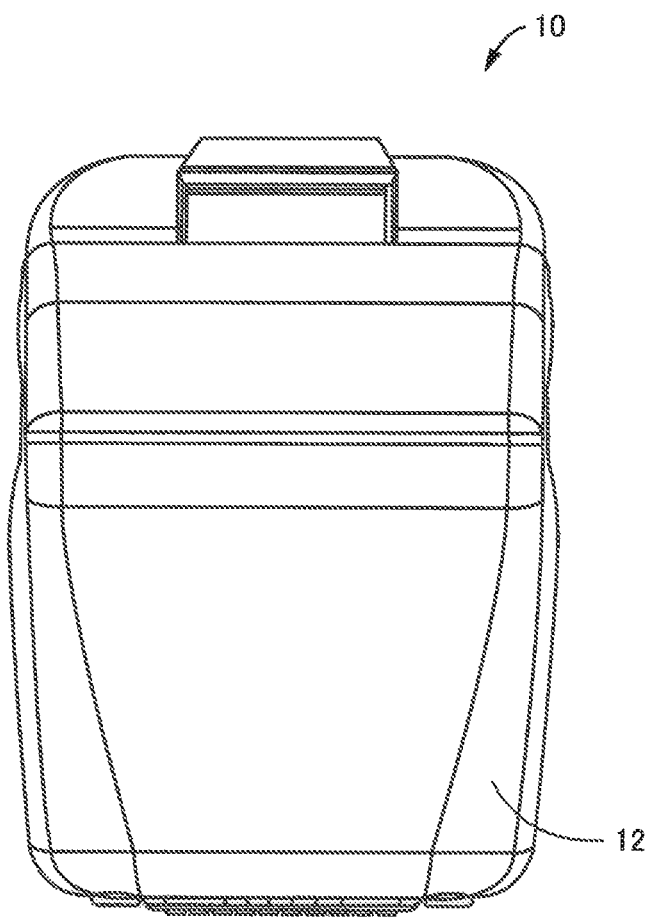
FIG. 2 is an external view on arrow A of the magnetic material detection device shown in FIG. 1.
Figure 3:
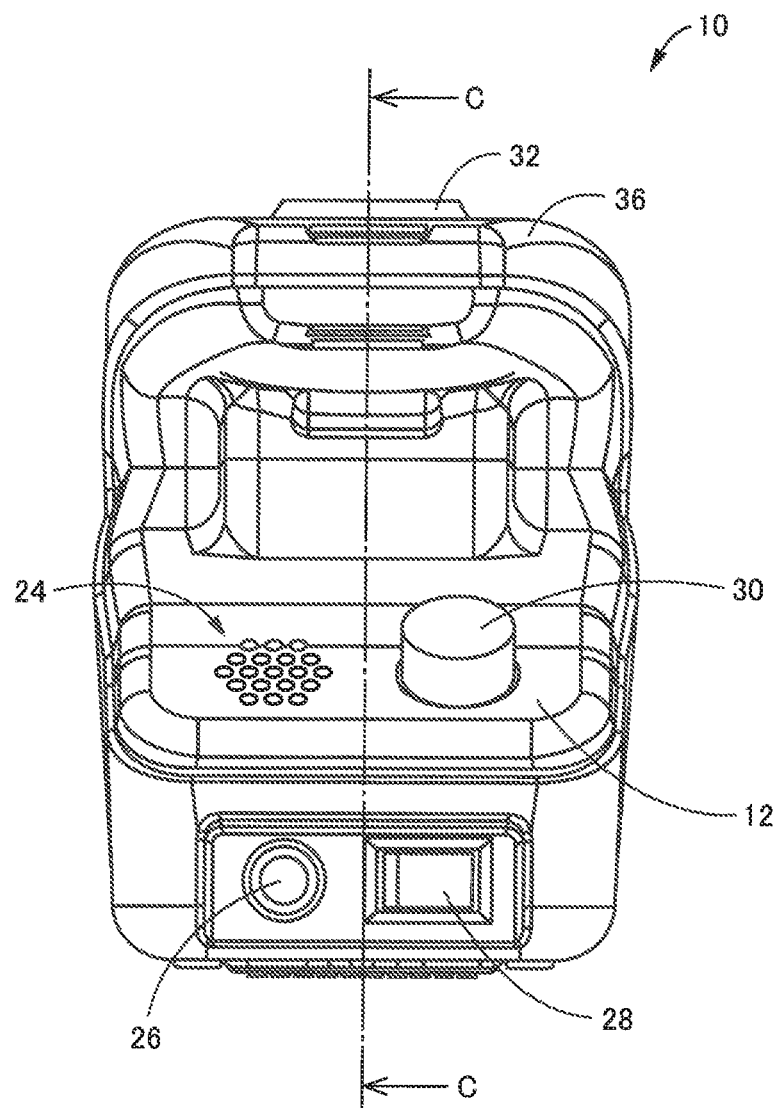
FIG. 3 is an external view on arrow B of the magnetic material detection device shown in FIG. 1.
Figure 4:
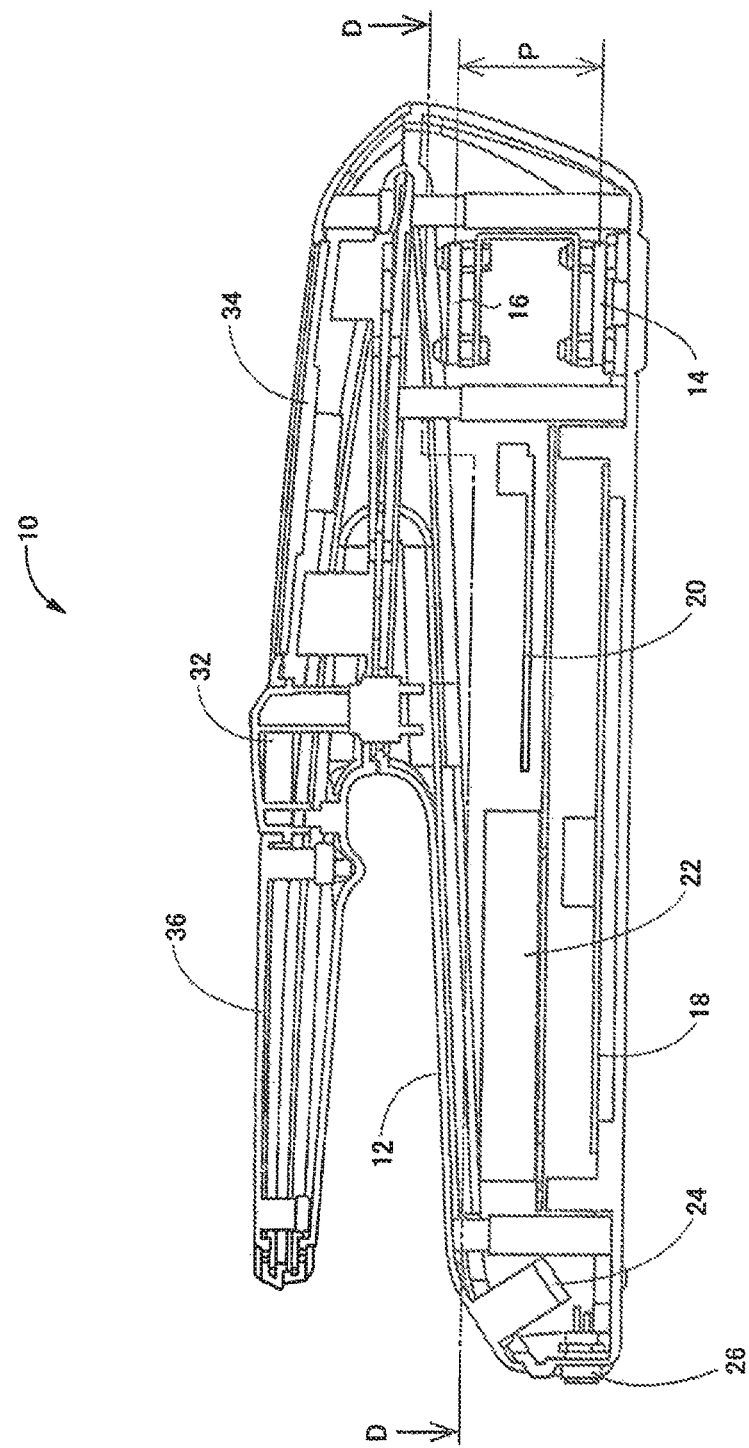
FIG. 4 is a cross-sectional view taken along a line C-C in the external view shown in FIG. 3.
Figure 5:
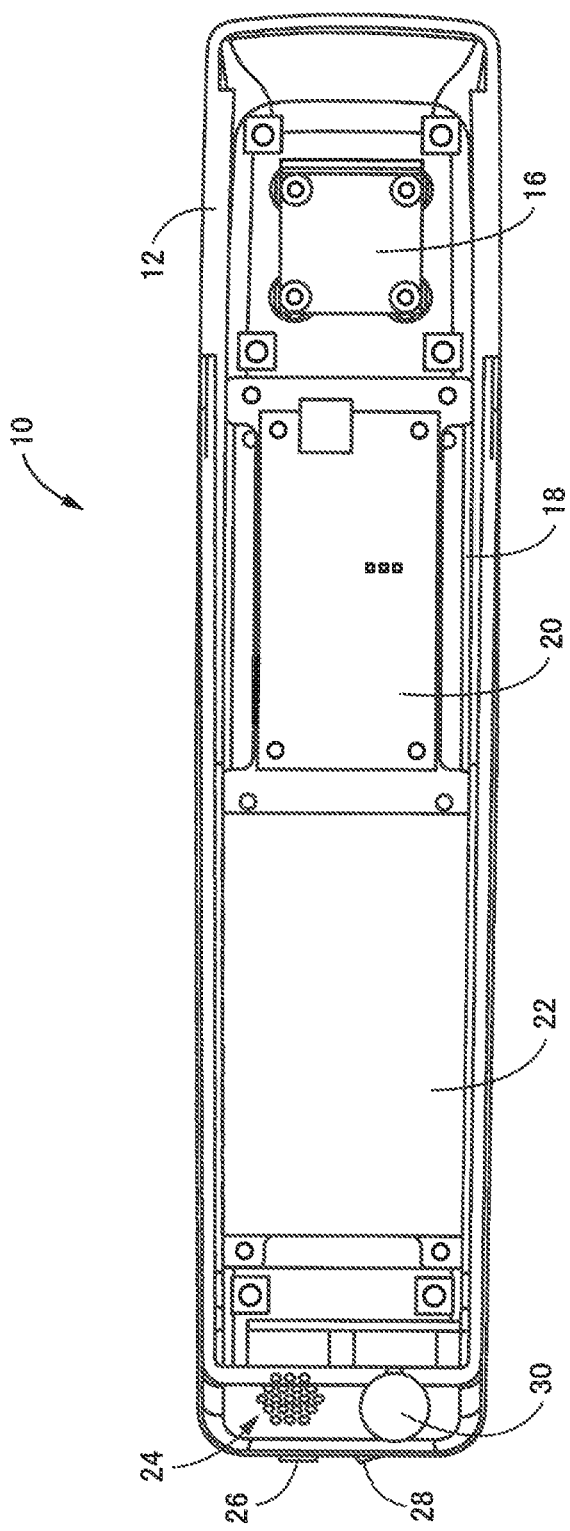
FIG. 5 is a cross-sectional view taken along a line D-D in the cross-sectional view taken along the line C-C shown in FIG. 4.
Figure 6:
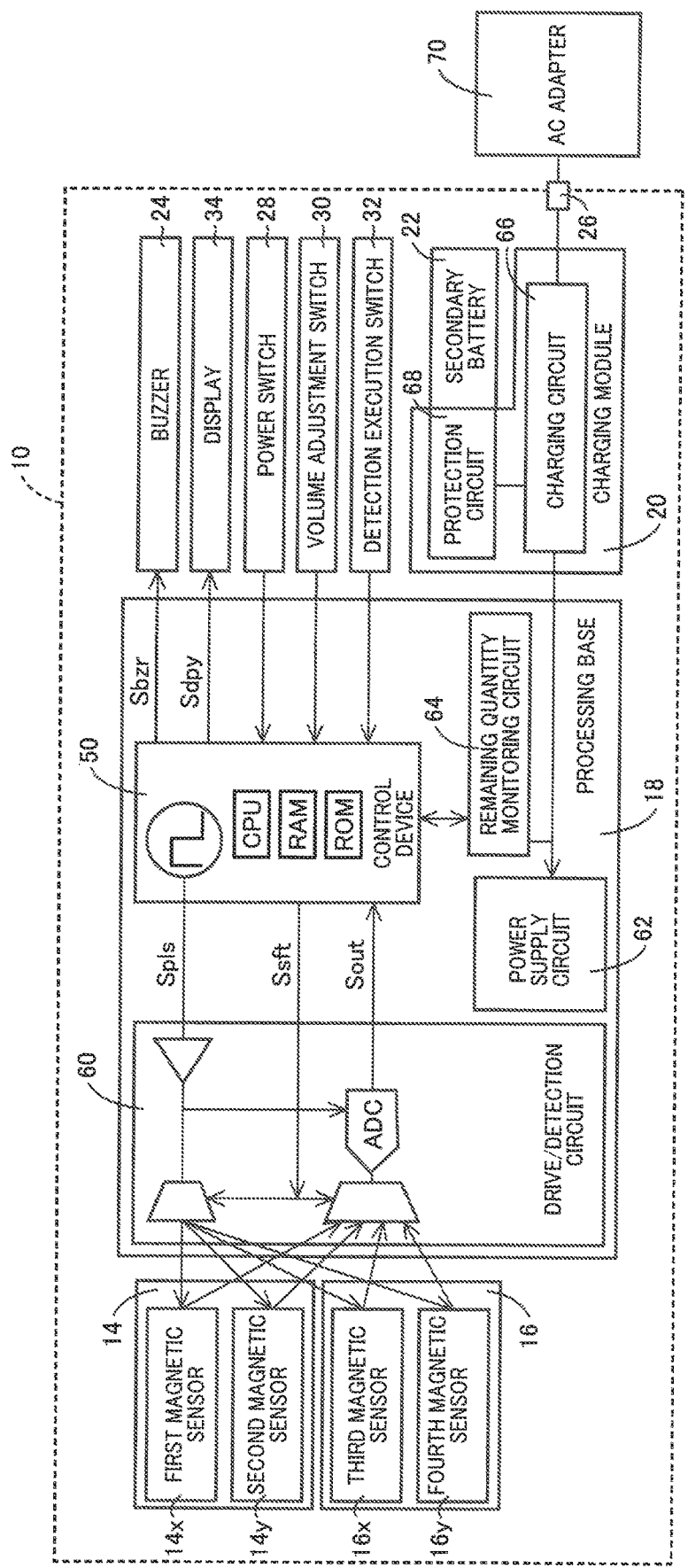
FIG. 6 is a block diagram of an electric connection relationship among portions included in the magnetic material detection device shown in FIG. 1.

FIG. 1 is an external view of an example of a magnetic material detection device 10 to which the present invention is applied. FIG. 2 is an external view on arrow A of the magnetic material detection device 10 shown in FIG. 1. FIG. 3 is an external view on arrow B of the magnetic material detection device 10 shown in FIG. 1. FIG. 4 is a cross-sectional view taken along a line C-C in the external view shown in FIG. 3. FIG. 5 is a cross-sectional view taken along a line D-D in the cross-sectional view taken along the line C-C shown in FIG. 4. FIG. 6 is a block diagram of an electric connection relationship among portions included in the magnetic material detection device 10.

In FIGS. 1 to 6, the magnetic material detection device 10 includes: a housing 12; a measurement sensor portion 14, a reference sensor portion 16, a processing base 18, a charging module 20, a secondary battery 22, and a buzzer 24 arranged inside the housing 12; and a charging jack 26, a power switch 28, a volume adjustment switch 30, a detection execution switch 32, and a display 34 disposed on the housing 12.

Figure 7:
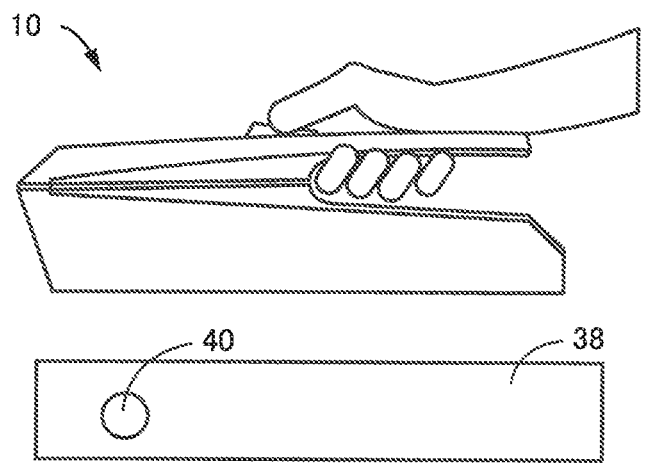
FIG. 7 is a diagram of an example of use of the magnetic material detection device by an operator.

The housing 12 includes a grip portion 36 so that an operator can easily hold the magnetic material detection device 10. For example, as shown in FIG. 7, the operator holds the magnetic material detection device 10 by gripping the grip portion 36 and moves the magnetic material detection device 10 to be close to and along a surface of a subject 38 to determine the presence/absence of a magnetic material 40. Therefore, the magnetic material detection device 10 is a portable size (handheld) magnetic material detection device. Although the magnetic material detection device 10 has an entire circumference of an external space of the measurement sensor portion 14 and the reference sensor portion 16 as a detection range for the magnetic material 40, the subject 38 is positioned in a space on the side opposite to the grip portion 36 when the magnetic material detection device 10 is used as shown in FIG. 7. Therefore, the sensor portion at a shorter distance from the subject 38 is referred to as the measurement sensor portion 14, and the sensor portion at a longer distance from the subject 38 is referred to as the reference sensor portion 16 to distinguish the two sensor portions.

The measurement sensor portion 14 and the reference sensor portion 16 are biaxial sensors (also referred to as two-dimensional sensors) each having two sensors with magnetically sensitive directions orthogonal to each other. In this example, one of the mutually orthogonal magnetically sensitive directions is defined as an x direction, and the other is defined as a y direction. The measurement sensor portion 14 has a first magnetic sensor 14$x$ in which the magnetically sensitive direction is the x direction, and a second magnetic sensor 14$y$ in which the magnetically sensitive direction is the y direction. The reference sensor portion 16 has a third magnetic sensor 16$x$ in which the magnetically sensitive direction is the same x direction as that of the first magnetic sensor 14x and a fourth magnetic sensor 16y in which the magnetically sensitive direction is the same y direction as that of the second magnetic sensor 14y. Each of the first to fourth magnetic sensors 14x, 14y, 16x, 16y is a vector-type magnetic sensor having the magnetically sensitive direction as one direction and is a magnetic impedance sensor (MI sensor), for example. As described above, the magnetic material detection device 10 has two pairs of two magnetic sensors having the same magnetic direction as in a pair of the first magnetic sensor 14x and the third magnetic sensor 16x and a pair of the second magnetic sensor 14y and the fourth magnetic sensor 16y. The two magnetic sensors in each of the pairs are arranged at an interval of a predetermined distance p from each other such that the subject 38 is located outside a space therebetween (see FIG. 7). Therefore, the magnetic material detection device 10 is not a device that detects the presence/absence of the magnetic material 40 when the subject 38 is allowed to pass through the space between the two magnetic sensors in each of the pairs. Therefore, the magnetic material detection device 10 can be miniaturized. The magnetic material detection device 10 detects the presence/absence of the magnetic material 40 by utilizing differentiating a distance between each of the two magnetic sensors in each of the pairs and the subject 38. The predetermined distance p is, for example, a distance between two magnetic sensors obtained in advance (i.e., predefined) experimentally or in design such that the presence/absence of the magnetic material 40 can properly be detected.

The processing base 18 includes a control device 50, a drive/detection circuit 60, a power supply circuit 62, and a remaining quantity monitoring circuit 64. The control device 50 is connected to the drive/detection circuit 60, and the drive/detection circuit 60 is connected to each of the first to fourth magnetic sensors 14x, 14y, 16x, 16y. The control device 50 causes the drive/detection circuit 60 to drive the measurement sensor portion 14 and the reference sensor portion 16, acquires output signals Sout after processing of electric signals output from the first to fourth magnetic sensors 14x, 14y, 16x, 16y via the drive/detection circuit 60, and detects the presence/absence of the magnetic material 40 by using values (also referred to as output values $Q_{kj}$) corresponding to the output signals Sout. The output signal Sout is detected as an output voltage. The output value $Q_{kj}$ is, for example, each of magnetic quantities (magnetic charges) or magnetic fluxes at the positions of the sensor portions 14, 16 according to the output signals Sout or may be the output voltage itself. In the output value $Q_{kj}$, Q is M for the measurement sensor portion 14 and R for the reference sensor portion 16. It is noted that k is x in the x direction and y in the y direction. Additionally, j is a numerical value of a natural number representative of the order of arranged data of the acquired output value $Q_{kj}$ in time series and is "j=1" for the latest data and a larger numerical value for older data. The output value $Q_{kj}$ is $M_{xj}$ for the first magnetic sensor 14x, $M_{yj}$ for the second magnetic sensor 14y, $R_{xj}$ for the third magnetic sensor 16x, and $R_{yj}$ for the fourth magnetic sensor 16y.

The control device 50 is connected to the power supply circuit 62 and the remaining quantity monitoring circuit 64, and the power supply circuit 62 and the remaining quantity monitoring circuit 64 are connected to the charging module 20. The charging module 20 includes a charging circuit 66 connected to the charging jack 26 and a protection circuit 68 connected to the secondary battery 22. The control device 50 causes the power supply circuit 62 etc. to operate the magnetic material detection device 10 by using an electric power of the secondary battery 22 or operate the magnetic material detection device 10 by using an electric power of an external commercial power supply such as a household power supply via an external AC adapter 70 connected to the charging jack 26. The control device 50 causes the power supply circuit 62 etc. to charge the secondary battery 22 by using an electric power from a commercial power supply etc. via the AC adapter 70 connected to the charging jack 26. The secondary battery 22 is a lithium battery, for example.

The control device 50 is connected to each of the buzzer 24, the power switch 28, the volume adjustment switch 30, the detection execution switch 32, and the display 34. The buzzer 24 is a device generating a sound for notification of detection of the magnetic material 40. The power switch 28 is an operation member operated for switching on and off of a main power supply of the magnetic material detection device 10. The volume adjustment switch 30 is an operation member for adjusting loudness of sound emitted from the buzzer 24. The detection execution switch 32 is an operation member for executing detection of the magnetic material 40 by the magnetic material detection device 10. The display 34 is disposed near the grip portion 36 and is a display for displaying a magnitude of the output value $Q_{kj}$, a distance between the magnetic material 40 and the magnetic sensor (particularly, the measurement sensor portion 14), a strength of a magnetic moment of the magnetic material 40 etc.

Figure 8:
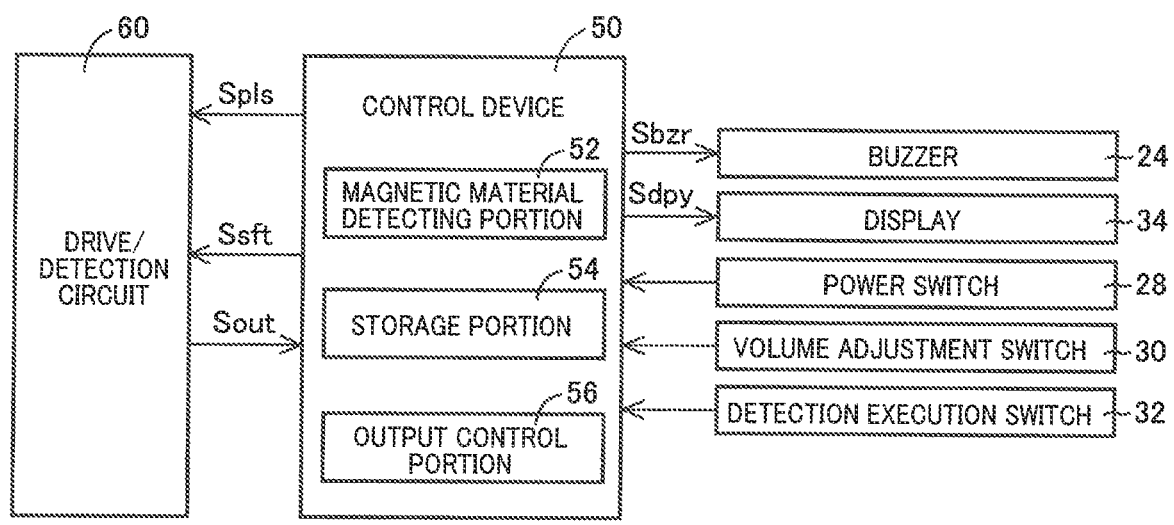
FIG. 8 is a diagram of an input/output system of a control device and is a functional block diagram for explaining main portions of a control function of the control device.

FIG. 8 is a diagram of an input/output system of the control device 50 and is a functional block diagram for explaining main portions of a control function of the control device 50. The control device 50 is a controller configured to include a so-called microcomputer including a CPU, a RAM, a ROM, and an input/output interface, for example. The CPU executes signal processes in accordance with programs stored in advance in the ROM, while the CPU utilizes a temporary storage function of the RAM, to provide various controls of the magnetic material detection device 10.

In FIG. 8, to implement various controls in the magnetic material detection device 10, the control device 50 includes a magnetic material detecting means, i.e., a magnetic material detecting portion 52, a storage means, i.e., a storage portion 54, and an output control means, i.e., an output control portion 56.

When the detection execution switch 32 is operated to an ON state by an operator, the magnetic material detecting portion 52 executes detection of the magnetic material 40 (see FIG. 7). The detection of the magnetic material 40 by the magnetic material detecting portion 52 will hereinafter be described in detail.

The magnetic material detecting portion 52 outputs a sensor drive pulse signal Spls for driving the measurement sensor portion 14 and the reference sensor portion 16 to the drive/detection circuit 60. The magnetic material detecting portion 52 outputs a switching control signal Ssft for switching between drive operation of the measurement sensor portion 14 and the reference sensor portion 16 and acquisition operation of the electric signals output from the first to fourth magnetic sensors 14x, 14y, 16x, 16y to the drive/detection circuit 60. The magnetic material detecting portion 52 acquires from the drive/detection circuit 60 the output signals Sout based on electric signals respectively output from the first to fourth magnetic sensors 14x, 14y, 16x, 16y. The magnetic material detecting portion 52 time-averages the output signals Sout of the first to fourth magnetic sensors 14x, 14y, 16x, 16y every predetermined time t and stores values (the output values $Q_{kj}$) corresponding to the output signals Sout after time-averaging in a time-series array in the storage portion 54. The predetermined time t is a time defined in advance to be suitable for using as data of the output values $Q_{kj}$, for example.

The magnetic material detecting portion 52 calculates absolute value components of magnetic quantities in the measurement sensor portion 14 and the reference sensor portion 16 and also stores the absolute value components of the magnetic quantities in a time-series array in the storage portion 54. Therefore, in the output values $Q_{kj}$, k includes "a" corresponding to the absolute value component (corresponding to the positive square root of $(Q_{kj}^2+Q_{yj}^2)$) in addition to "x" and "y" corresponding to magnetic field vector components. In other words, the output value $Q_{kj}$ includes $M_{aj}$ in the measurement sensor portion 14 and $R_{aj}$ in the reference sensor portion 16 in addition to $M_{xj}$, $M_{yj}$, $R_{xj}$, and $R_y$, described above.

The magnetic material detecting portion 52 applies $max_i$ pieces of data from the latest data of the magnetic field vector components ($Q_{xj}$, $Q_{yj}$) and the absolute value components ($Q_{aj}$) of the output values $Q_{kj}$ in the measurement sensor portion 14 and the reference sensor portion 16 to predefined Eq. (1) below to calculate a time differential value (synonymous with a time change amount and a gradient of time change) $A_{Qk}$, which is a gradient of a regression line of the output values $Q_{kj}$. The time change amount $A_{Qk}$ is generated due to a change in relative position between the subject 38 and the magnetic sensors (the measurement sensor portion 14, the reference sensor portion 16). In this example, six pieces $A_{Mx}$, $A_{My}$, $A_{Ma}$, $A_{Rx}$, $A_{Ry}$, $A_{Ra}$ are calculated as the time change amount $A_{Qk}$. For example, the time change amount $A_{Rx}$ is a time change amount of an x-direction component of the reference sensor portion 16 (i.e., the output value $R_{xj}$ of the third magnetic sensor 16x). Although a predefined fixed value may be used in consideration of the responsiveness of detection of the magnetic material 40 for the $max_i$, the $max_i$ may be changed depending on variation of the output value $Q_{kj}$ or may be changed depending on an operation speed of the magnetic material detection device 10. For example, a small value is appropriate for $max_i$ when the magnetic material detection device 10 is quickly operated (moved), while a large value is appropriate for $max_i$ when the magnetic material detection device 10 is slowly operated.

[Mathematical 1]

$$A_{Qk} = \frac{\left\{\sum_{j=1}^{max_i} Q_{kj} \cdot j\right\} - \frac{\left\{\sum_{j=1}^{max_i} j\right\}\left\{\sum_{j=1}^{max_i} Q_{kj}\right\}}{max_i}}{\sum_{j=1}^{max_i} j^2 - \frac{\left(\sum_{j=1}^{max_i} j\right)^2}{max_i}} \quad (1)$$

($Q$ is $M$ or $R$, and $k$ is $x$, $y$, or $a$)

In an environment magnetic field in which the magnetic material 40 does not exist near the magnetic sensors (the measurement sensor portion 14, the reference sensor portion 16), the time change amounts $A_{Qk}$ ($A_{Mk}$, $A_{Rk}$) of the output values $Q_{kj}$ ($M_{kj}$, $R_{kj}$) of the two magnetic sensors have substantially the same values. On the other hand, in such a situation that the magnetic sensors approach the magnetic material 40, the absolute value of the time change amount $A_{Qk}$ becomes larger in the measurement sensor portion 14 close to the magnetic material 40 as compared to the reference sensor portion 16 far from the magnetic material 40. In this example, the magnetic material 40 is detected by utilizing such a phenomenon while an influence of a change in the geomagnetism on the magnetic sensors is eliminated as much as possible. Specifically, the control device 50 uses the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) to detect the magnetic material 40. Particularly, since the magnetic sensors of this example are vector-type magnetic sensors, the control device 50 uses the time change amounts of the output values of the two magnetic sensors having the same magnetically sensitive direction, i.e., the time change amount $A_{Mx}$ and the time change amount $A_{RM}$, or the time change amount $A_{My}$ and the time change amount $A_{Ry}$, or the time change amount $A_{Ma}$ and the time change amount $A_{Ra}$, to detect the magnetic material 40.

Specifically, the magnetic material detecting portion 52 calculates an evaluation value $B_k$ ($=A_{Mk}-A_{Rk}$) that is a difference between the calculated time change amount $A_{Mk}$ in the measurement sensor portion 14 and the calculated time change amount $A_{Rk}$ in the reference sensor portion 16. The magnetic material detecting portion 52 detects the presence/absence of the magnetic material 40 based on whether the absolute value of the evaluation value $B_k$ exceeds a threshold value THbk. Specifically, the magnetic material detecting portion 52 detects the presence/absence of the magnetic material 40 based on whether any of the absolute values of the evaluation values $B_k$ (i.e., $B_x$, $B_y$, $B_a$) exceeds the threshold value THbk (i.e., a threshold value THbkx, a threshold value THbky, a threshold value THbka set respectively for the evaluation values $B_k$). When the absolute value of the evaluation value $B_k$ exceeds the threshold value THbk, the magnetic material detecting portion 52 determines that the magnetic material 40 is present (i.e., determines that the magnetic material 40 is detected). The threshold value THbk is a predefined lower limit value of the evaluation value $B_k$ at which the magnetic material 40 can be determined as being present, for example. In this way, the control device 50 detects the magnetic material 40 by using the evaluation value $B_k$ that is a difference between the time change amounts of the output values of the two magnetic sensors.

When the magnetic material 40 is detected, the magnetic material detecting portion 52 establishes a magnetic material detection mode. When the magnetic material 40 is detected, the magnetic material detecting portion 52 outputs to the output control portion 56 a command to emit a sound from the buzzer 24. The output control portion 56 outputs to the buzzer 24 a sound signal Sbzr for emitting a sound at a volume set by the volume adjustment switch 30. When the magnetic material 40 is detected, the magnetic material detecting portion 52 outputs to the output control portion 56 a command to display a detection status of the magnetic material 40 on the display 34. The output control portion 56 outputs to the display 34 a display signal Sdpy for displaying the detection status of the magnetic material 40. The detection status of the magnetic material 40 is, for example, a magnitude of the output value $Q_{kj}$, a distance between the magnetic material 40 and the measurement sensor portion 14, a strength of the magnetic moment of the magnetic material 40, etc.

Even though the magnetic material detection device 10 is located near the magnetic material 40, the time change amount $A_{Qk}$ used for determining the presence/absence of the magnetic material 40 becomes zero if an operator does not move the magnetic material detection device 10. Therefore, the distance between the magnetic material 40 and the measurement sensor portion 14 and the strength of the magnetic moment of the magnetic material 40 cannot be calculated using the time change amount $A_{Qk}$. On the other hand, it is conceivable to use the output value $Q_{kj}$ (e.g., use of a difference of the output value $M_{kj}$ and the output value $R_{kj}$). However, if the measurement sensor portion 14 and the reference sensor portion 16 have individual variations or the environmental magnetic field itself has distribution, the difference does not become zero even if the magnetic material 40 is not present. Therefore, use of the difference itself may reduce a calculation accuracy.

Therefore, in this example, a latest output value $Q_{k1}$ is self-reset by using the output value $Q_{kj}$ immediately before determining the presence of the magnetic material 40, and the strength of the magnetic moment of the magnetic material 40 etc. are calculated. In other words, to eliminate the influence of the geomagnetism as much as possible, on the assumption that the output value $Q_j$ immediately before determining the presence of the magnetic material 40 is attributable to the geomagnetism exclusively affecting the magnetic sensor, the strength of the magnetic moment of the magnetic material 40 etc. are calculated by using an output value change amount Qk (also referred to as a self-reset value $Q_k$) obtained by subtracting an immediately preceding output value $Q_{kj}$ from the latest output value $Q_{k1}$ after detection of the magnetic material 40. Thus, when the magnetic material 40 is detected, the control device 50 calculates the distance between the magnetic material 40 and the measurement sensor portion 14 as well as the strength of the magnetic moment of the magnetic material 40 by using the self-reset value $Q_k$ defined as the output value change amounts from the immediately preceding timing in the two magnetic sensors obtained by subtracting the output value $Q_{kj}$ acquired immediately before a first detection of the magnetic material 40 from the latest output value $Q_{k1}$. For the magnitude of the output value $Q_{kj}$ displayed on the display 34 as the detection status of the magnetic material 40, it is appropriate to use the self-reset value $Q_k$ from which the influence of the geomagnetism is eliminated as much as possible. Particularly, in this example, a self-reset value $M_a$ is used out of the self-reset value $Q_{kj}$.

Specifically, when it is determined that the magnetic material 40 is detected, $max_i$ pieces of data are used from the latest data of the output value $Q_{kj}$. Therefore, data from the ($max_i+1$)th piece is used as the output value $Q_{kj}$ immediately before the detection. For example, as described in predefined Eq. (2) below, the magnetic material detecting portion 52 uses as the output value $Q_{kj}$ immediately before detection an average value (referred to as a past average value Average($Q_{kj}$)) of n pieces of data from the ($max_i+1$)th piece of time series data of the output values $Q_{kj}$. The n is a value predefined as the number of pieces sufficient for averaging so as to eliminate noises of the output value $Q_{kj}$ immediately before detection, for example, and may be about the same as $max_i$. The magnetic material detecting portion 52 calculates the past average value Average($Q_{kj}$) only once when the magnetic material detection mode is first established, and uses the past average value Average($Q_{kj}$) as it is without updating the value Average($Q_{kj}$) during the continuation of the magnetic material detection mode. Therefore, the magnetic material detecting portion 52 determines whether the magnetic material detection mode is established for the first time, and if it is determined that the magnetic material detection mode is established for the first time, the magnetic material detecting portion 52 calculates the past average value Average($Q_{kj}$) by using Eq. (2) below. While the magnetic material detection mode is established, the magnetic material detecting portion 52 calculates the self-reset value $Q_k$ (=$Q_{kj}$−Average($Q_{kj}$)) by subtracting the past average value Average($Q_{kj}$) from the latest output value $Q_{k1}$. In this example, six values $M_x$, $M_y$, $M_a$, $R_x$, $R_y$, and $R_a$ are calculated as the self-reset value $Q_k$.

[Mathematical 2]

$$\text{Average}(Q_k) = \frac{1}{n} \sum_{j=max_i+1}^{max_i+1+n} Q_{kj} \quad (2)$$

($Q$ is $M$ or $R$, and $k$ is $x$, $y$, or $a$)

Assuming the self-reset value $Q_k$ (in this example, $Q_a$ corresponding to the absolute value component) as a magnetic field generated by one magnetic dipole (magnetic moment), the magnetic moment is approximated by using a general equation of Eq. (3) below. In equation (3) below, $b_i$ is an i-th output of the magnetic sensor arranged in the z direction (in this example, the distance direction between the magnetic material detection device 10 and the magnetic material 40), $M_z$ is a distance to the magnetic material 40 from the magnetic sensor closest to the magnetic material 40, m absorbing $k_i$ is a value proportional to the strength of the magnetic moment, and $\Delta z$ is an interval between the magnetic sensors. When the values in the magnetic material detection device 10 are applied to Eq. (3) below, relational expressions described as Eqs. (4) and (5) below are established. In this example, "i" in Eq. (3) below is 1, and "$\Delta z$" is p (i.e., the predetermined distance p). By solving simultaneous equations described as Eqs. (4) and (5) below, relational expressions described as Eqs. (6) and (7) below are derived. The magnetic material detecting portion 52 calculates the distance $M_z$ and the value m proportional to the strength of the magnetic moment by using the relational expressions described as Eqs. (6) and (7) below. The distance $M_z$ corresponds to the distance between the magnetic material 40 and the measurement sensor portion 14. The value m corresponds to the strength of the magnetic moment of the magnetic material 40. However, the value m is a value proportional to the magnetic moment amount and is not the absolute value. Therefore, the strength of the magnetic moment is preferably displayed on the display 34 with level values indicative of the strength in stages rather than displaying the absolute value.

[Mathematical 3]

$$b_i = k_i \frac{m}{(M_z + \Delta z_i)^3} \rightarrow \frac{m}{(M_z + \Delta z_i)^3} \quad (3)$$

($k_i$ is absorbed in $m$)

$$M_a = \frac{m}{M_z^3} \quad (4)$$

$$R_a = \frac{m}{(M_z + p)^3} \quad (5)$$

$$M_z = \frac{p\left(\frac{R_a}{M_a}\right)^{\frac{1}{3}}}{1 - \left(\frac{R_a}{M_a}\right)^{\frac{1}{3}}} \quad (6)$$

$$m = M_a \cdot M_z^3 \quad (7)$$

Figure 9:
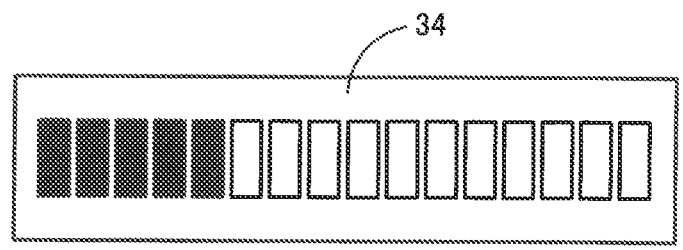
FIG. 9 is a diagram of an example displaying a strength of a signal corresponding to a magnetic material on a display.
Figure 10:
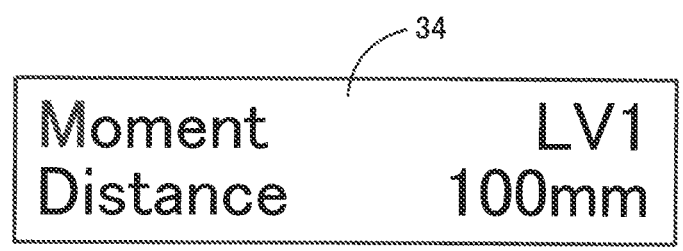
FIG. 10 is a diagram of an example displaying a strength of the magnetic moment of the magnetic material and a distance to the magnetic material on the display.

When the magnetic material 40 is detected, the magnetic material detecting portion 52 outputs to the output control portion 56 a command to display on the display 34 the self-reset value $M_a$ as a strength of a signal of the magnetic material 40 (e.g., a magnitude of a magnetic quantity at the position of the measurement sensor portion 14). For example, as shown in FIG. 9, the output control portion 56 outputs to the display 34 the display signal Sdpy for displaying the self-reset value $M_a$ in association with a bar graph. When the magnetic material 40 is detected, the magnetic material detecting portion 52 outputs to the output control portion 56 a command to display on the display 34 the value m as the strength of the magnetic moment of the magnetic material 40 and the distance $M_z$ as the distance between the magnetic material 40 and the measurement sensor portion 14. The output control portion 56 outputs to the display 34 the display signal Sdpy for displaying a level value (see "LV1" in FIG. 10) corresponding to the value m and a value (see "100 mm" in FIG. 10) indicative of the distance $M_z$, as shown in FIG. 10, for example. When the magnetic material 40 is detected, the display as shown in FIG. 9 and the display as shown in FIG. 10 may alternately be displayed at predetermined intervals, or the display as shown in FIG. 9 may be performed when the detection execution switch 32 is operated to the ON state, whereas the display as shown in FIG. 10 may be performed when the detection execution switch 32 is in an OFF state.

Description will then be made of a method of determining that the magnetic material detection device 10 is moved away from the magnetic material 40 (i.e., the magnetic material 40 is not present near the magnetic material detection device 10) after detection of the magnetic material 40.

When the magnetic material 40 is detected, the control device 50 determines whether the detected magnetic material 40 has become more distant from the magnetic sensor based on whether a ratio of the self-reset value $Q_k$ to the maximum value of the self-reset value $Q_k$ (also referred to as a self-reset maximum value $MAX_{Qk}$) is less than a predetermined ratio Th. If a ratio of the self-reset value $Q_k$ to the maximum value of the self-reset value $Q_k$ (also referred to as a self-reset maximum value $MAX_{Qk}$) is less than a predetermined ratio Th when the magnetic material detection mode is established, the control device 50 cancels the magnetic material detection mode. The predetermined ratio Th is a predetermined threshold value for determining that the magnetic material 40 has become distant from the magnetic sensor, for example.

Specifically, for the self-reset value $Q_k$ used for determining the cancellation of the magnetic material detection mode, the self-reset value $M_k$ in the measurement sensor portion 14 is used. For "k" in the self-reset value $M_k$, "k" corresponds to the component at the time of determination of establishment of the magnetic material detection mode out of "x" and "y" corresponding to the magnetic field vector component and "a" corresponding to the absolute value component. In this example, the "k" corresponding to the component at the time of determination of establishment of the magnetic material detection mode is defined as "u". The self-reset value $Q_k$ used for determining the cancellation of the magnetic material detection mode is a self-reset value $M_u$.

While the magnetic material detection mode is established, the magnetic material detecting portion 52 updates the maximum value of the self-reset value $M_u$ (also referred to as a self-reset maximum value $MAX_{Mu}$) as necessary. The magnetic material detecting portion 52 determines the cancellation of the magnetic material detection mode by using Eq. (8) below. "ABS" in Eq. (8) below represents an absolute value. When Eq. (8) below is satisfied (i.e., when a ratio of the self-reset value $M_u$ to the maximum value of the self-reset value $MAX_{Mu}$ is less than the predetermined ratio Th), the magnetic material detecting portion 52 cancels the magnetic material detection mode. The magnetic material detecting portion 52 cancels the magnetic material detection mode also when the detection execution switch 32 is switched from the ON state to the OFF state.

[Mathematical 4]

$$\text{ABS}\left(\frac{M_u}{MAX_{Mu}}\right) < Th \qquad (8)$$

($u$ is $x$, $y$, or $a$)

Figure 11:
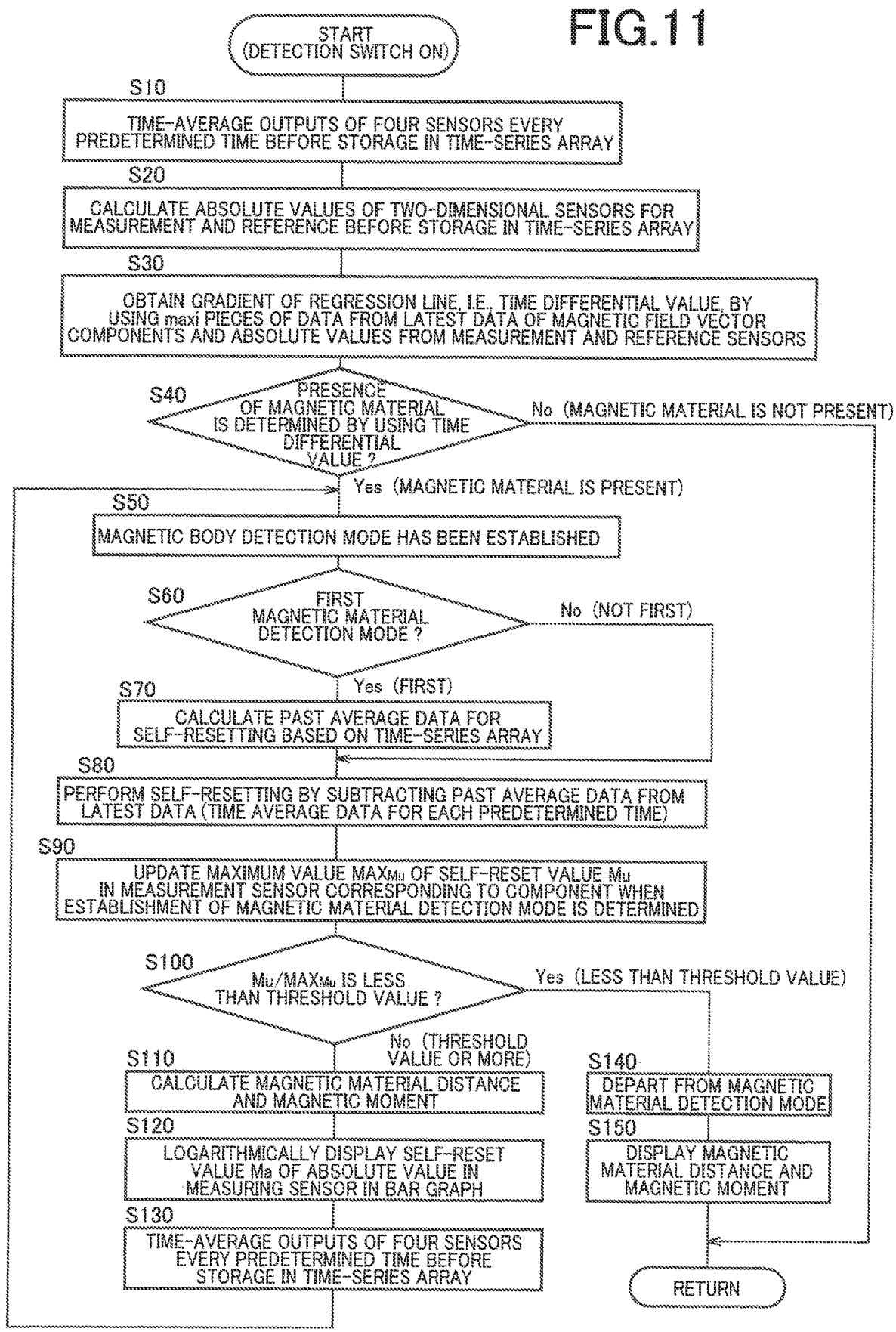
FIG. 11 is a flowchart for explaining main portions of a control operation of the control device, i.e., a control operation for improving a detection accuracy of the magnetic material when the magnetic material is detected by using output values of two magnetic sensors.

FIG. 11 is a flowchart for explaining main portions of a control operation of the control device 50, i.e., a control operation for improving the detection accuracy of the magnetic material 40 when the magnetic material 40 is detected by using the output values $Q_{kj}$ of the two magnetic sensors, and this flowchart is repeatedly executed when the detection execution switch 32 is in the ON state, for example.

In FIG. 11, first, at step (hereinafter, step is omitted) S10 corresponding to a function of the magnetic material detecting portion 52, the output signals Sout of the first to fourth magnetic sensors 14x, 14y, 16x, 16y are time-averaged every predetermined time t, and the output values $Q_{xj}$ ($M_{xj}$, $R_{xj}$), $Q_{yj}$ ($M_{yj}$, $R_{yj}$) corresponding to the output signals Sout after the time-averaging are stored in a time-series array in the storage portion 54. Subsequently, at S20 corresponding to the function of the magnetic material detecting portion 52, the absolute value components of the magnetic quantities in the measurement sensor portion 14 and the reference sensor portion 16 are calculated, and the output values $Q_{aj}$ ($M_{aj}$, $R_{aj}$) of the absolute value components of the magnetic quantities are stored in a time-series array in the storage portion 54. Subsequently, at S30 corresponding to the function of the magnetic material detecting portion 52, $max_j$ pieces of data are applied to Eq. (1) above from the latest data of the magnetic field vector components ($Q_{xj}$, $Q_{yj}$) and the absolute value components ($Q_{aj}$) of the output values $Q_{kj}$ in the measurement sensor portion 14 and the reference sensor portion 16, and the time differential values (time change amounts) $A_{Qk}$ ($A_{Mk}$, $A_{Rk}$) are calculated. Subsequently, at S40 corresponding to the function of the magnetic material detecting portion 52, the presence/absence of the magnetic material 40 is detected based on whether any of the absolute values of the evaluation values $B_k$ (=$A_{Mk}$−$A_{Rk}$) exceeds the respective threshold values THbk. If the determination of S40 is negative (i.e., when it is determined that the magnetic material 40 is not present), this routine is terminated. If the determination of S40 is affirmative (i.e., when it is determined that the magnetic material 40 is present), it is determined at S50 corresponding to the function of the magnetic material detecting portion 52 that the magnetic material detection mode has been established. Subsequently, at S60 corresponding to the function of the magnetic material detecting portion 52, it is determined whether the magnetic material detection mode has been established for the first time. If the determination at S60 is affirmative, the past average value Average($Q_k$) for self-resetting is calculated by using Eq. (2) above at S70 corresponding to the function of the magnetic material detecting portion 52. If the determination of S60 is negative, or subsequent to S70, the past average value Average($Q_k$) is subtracted from the latest output value $Q_{k1}$ to calculate the self-reset value $Q_k$ at S80 corresponding to the function of the magnetic material detecting portion 52. Subsequently, at S90 corresponding to the function of the magnetic material detecting portion 52, an update is made as necessary to the maximum value $MAX_{MU}$ of the self-reset value $M_u$ in the measurement sensor portion 14 corresponding to the component at the time of determination of the establishment of the magnetic material detection mode. Subsequently, at S100 corresponding to the function of the magnetic material detecting portion 52, it is determined whether the absolute value of $M_u/MAX_{Mu}$ is less than the threshold value (the predetermined ratio Th) (see Eq. (8) above). If the determination of S100 is negative, the relational expressions described as Eqs. (6) and (7) above are used at S110 corresponding to the function of the magnetic material detecting portion 52 for calculating the value m corresponds to the strength of the magnetic moment of the magnetic material 40 and the distance $M_z$ corresponding to the distance between the magnetic material 40 and the measurement sensor portion 14. Subsequently, at S120 corresponding to functions of the magnetic material detecting portion 52 and the output control portion 56, for example, as shown in FIG. 9, the self-reset value $M_a$ corresponding to the absolute value component of the self-reset value $M_k$ in the measurement sensor portion 14 is displayed on the display 34 in association with a bar graph. Subsequently, at S130 corresponding to the function of the magnetic material detecting portion 52, similarly to S10, the output values $Q_{xj}$, $Q_{yj}$ corresponding to the output signals Sout after time-averaging are stored in a time-series array in the storage portion 54. At S130, similarly to S20, the output values $Q_{aj}$ of the absolute value components are also stored in a time-series array in the storage portion 54. The control operation is then returned to S50. On the other hand, if the determination of S100 is affirmative, the operation is departed from the magnetic material detection mode (i.e., the magnetic material detection mode is canceled) at S140 corresponding to the function of the magnetic material detecting portion 52. In this case, the maximum value $MAX_{Mu}$ of the self-reset value $M_u$ is reset to zero. Subsequently, at S150 corresponding to the functions of the magnetic material detecting portion 52 and the output control portion 56, a level value corresponding to the value m and a value indicative of the distance $M_z$ are displayed on the display 34 as shown in FIG. 10, for example.

As described above, according to this example, the magnetic material 40 is detected by using the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) arranged at a mutual interval of the predetermined distance p with the subject 38 positioned outside a space therebetween, so that the magnetic material 40 can be detected while an influence of a change in the geomagnetism on the magnetic sensors is eliminated as much as possible. Specifically, by using such a phenomenon that in an environment magnetic field in which the magnetic material 40 does not exist near the magnetic sensors, the time change amounts $A_{Qk}$ of the two magnetic sensors have substantially the same values, whereas in such a situation that the magnetic sensors approach the magnetic material 40, the absolute value of the time change amount $A_{Qk}$ becomes larger in the measurement sensor portion 14 close to the magnetic material 40 as compared to the reference sensor portion 16 far from the magnetic material 40, the magnetic material 40 can be detected while an influence of a change in the geomagnetism on the magnetic sensors is eliminated as much as possible. Therefore, when the magnetic material 40 is detected by using the output values $Q_{kj}$ of the two magnetic sensors, the detection accuracy of the magnetic material 40 can be improved.

According to this example, since the magnetic material 40 is detected by using the time change amounts $A_{Qk}$ of the output values $Q_{kj}$ of the two vector-type magnetic sensors having the same magnetically sensitive directions, the magnetic material 40 can properly be detected.

According to this example, the magnetic material 40 is detected by using the evaluation value $B_k$ that is a difference between the time change amounts of the output values of the two magnetic sensors, and therefore, by utilizing the phenomenon as described above, the magnetic material 40 can be detected while an influence of a change in the geomagnetism on the magnetic sensors is eliminated as much as possible.

According to this example, when the magnetic material 40 is detected, the distance between the magnetic material 40 and the measurement sensor portion 14 as well as the strength of the magnetic moment of the magnetic material 40 are calculated by using the self-reset value $Q_k$ defined as the output value change amounts from the immediately preceding timing in the two magnetic sensors obtained by subtracting the output value $Q_{kj}$ acquired immediately before a first detection of the magnetic material 40 from the latest output value $Q_{k1}$, and therefore, even if no change is made in relative position between the magnetic material 40 and the magnetic sensors (i.e., even if the time change amount $A_{Qk}$ of the output values $Q_{kj}$ of the magnetic sensor is zero) at the time of detection of the magnetic material 40, the distance between the magnetic material 40 and the magnetic sensor as well as the strength of the magnetic moment of the magnetic material 40 can be calculated. In this case, since the self-reset value $Q_k$ is used, where the self-reset value $Q_k$ is obtained by subtracting the output value $Q_{kj}$ of the magnetic sensor, and the output value $Q_k$ is attributed from the geomagnetism which affects exclusively the magnetic sensor immediately before the detection of the magnetic material 40, the influence of the geomagnetism on the magnetic sensor can be eliminated as much as possible.

According to this example, when the magnetic material 40 is detected, it is determined whether the detected magnetic material 40 has become more distant from the magnetic sensor based on whether a ratio of the self-reset value $Q_k$ to the maximum value of the self-reset value $MAX_{Qk}$ is less than a predetermined ratio Th, and therefore it is properly determined that the magnetic material 40 and the magnetic sensor are moved away from each other after the magnetic material 40 is detected.

According to this example, when a ratio of the self-reset value $Q_k$ the maximum value of the self-reset value $MAX_{Qk}$ is less than a predetermined ratio Th while the the magnetic material detection mode is established, the magnetic material detection mode is canceled, and therefore, the magnetic material detection mode can properly be canceled after the magnetic material detection mode is established.

The magnetic material detection device 10 is a passive type magnetic material detection device, does not affect other devices unlike a metal detector, and therefore can be used for screening a person wearing a cardiac pacemaker. It is supposed that the use applications of the magnetic material detection device 10 include screening of a person before entering an MRI room, inspection at an airport, etc. Additionally, after detecting the magnetic material 40, the magnetic material detection device 10 can detect the existence of the magnetic material 40 as long as the magnetic material detection device 10 is in the vicinity of the magnetic material 40 even when the magnetic material detection device 10 or the magnetic material 40 is not moving. The magnetic material detection device 10 can use the entire circumference of an external space of the measurement sensor portion 14 and the reference sensor portion 16 as a detection range of the magnetic material 40. The magnetic material detection device 10 can use only the space on the measurement sensor portion 14 side as the detection range by enabling the detection of the magnetic material 40 if the absolute value of the time change amount A of the output value $M_{kj}$ in the measurement sensor portion 14 is relatively larger than that of the reference sensor portion 16. By using the magnetic material detection device 10, the position of the magnetic material 40 is more easily specified. The magnetic material detection device 10 has the secondary battery 22 built-in and therefore can be used as a portable device. The magnetic material detection device 10 can also be used with the AC adapter 70 kept connected.

Another example of the present invention will be described.

Second Example

In the first example described above, the magnetic material detecting portion 52 applies $max_i$ pieces of data from the latest data of the output values $Q_{kj}$ in the measurement sensor portion 14 and the reference sensor portion 16 to Eq. (1) above to calculate the time change amounts $A_{Qk}$ of the output values $Q_{kj}$. The output value $Q_{kj}$ is a value stored every predetermined time t in a time-series array in the storage portion 54, and the $max_i$ has one type of a predetermined value. Therefore, in the first example described above, the control device 50 calculates the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) in time intervals of the same length starting from the same time point, where the time intervals have a same length, and uses the time change amounts $A_{Qk}$ under the time intervals of the same length to detect the magnetic material 40. In this way, the control device 50 detects the magnetic material 40 by using the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) in the time intervals of the same length starting from the same time point.

In this example, unlike the first example, multiple types of predetermined values are used for the $max_i$. Therefore, in this example, the control device 50 respectively calculates the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) in time intervals of the same length starting from the same time point for each of multiple types of time intervals having different lengths. The magnetic material detecting portion 52 calculates each of the evaluation values $B_k$ (=$A_{Mk}$−$A_{Rk}$) for each of the multiple types of time intervals, determines whether the absolute values of these evaluation values $B_k$ exceed the threshold values THbk (i.e., the threshold values respectively set for the evaluation values $B_k$), and detects the presence/absence of the magnetic material 40 based on whether any of the absolute values of the evaluation values $B_k$ exceeds the threshold values THbk. When any one of the absolute values of these evaluation values $B_k$ exceeds the threshold values THbk, the magnetic material detecting portion 52 determines that the magnetic material 40 is present. Therefore, the control device 50 detects the magnetic material 40 by using the time change amount $A_{Qk}$ in the time intervals of the same length out of multiple types of time intervals. As described above, also in this example, the control device 50 detects the magnetic material 40 by using the time change amounts $A_{Qk}$ ($A_{Mk}$, $A_{Rk}$) of the output values $Q_{kj}$ ($M_{kj}$, $R_{kj}$) of the two magnetic sensors (the measurement sensor portion 14, the reference sensor portion 16) in the time intervals of the same length starting from the same time point.

The multiple types of predetermined values used for the $max_i$ are, for example, two types of predetermined values, which are $max_i$ having a relatively large value and $max_i$ having a relatively small value. The magnitude of the value of $max_i$ corresponds to the length of the time interval. Depending on variations of the output values $Q_{kj}$, the time change amount $A_{Qk}$ may become larger in a short time interval than a long time interval, or the time change amount $A_{Qk}$ may become smaller in a short time interval than a long time interval. Therefore, when the $max_i$ is set to multiple types of predetermined values, the tendency of the time change amounts $A_{Qk}$ is more easily comprehended as compared to when the $max_i$ is set to one type of a predetermined value. The length of the time interval is related to an operation speed or a movement distance of the magnetic material detection device 10 when the magnetic material detection device 10 is operated. Therefore, by setting multiple types of time intervals, i.e., $max_i$, the magnetic material 40 can more accurately be detected even if a difference exists in the speed of operation of the magnetic material detection device 10 by an operator.

In FIG. 11, particularly, a difference from the first example is in that at S30 corresponding to the function of the magnetic material detecting portion 52, when the time change amounts $A_{Qk}$ are calculated, $max_i$ has multiple types of values rather than one type of a value. Additionally, a difference from the first example is in that at S40 corresponding to the function of the magnetic material detecting portion 52, the absolute values of the evaluation values $B_k$ are values corresponding to each of multiple types of $max_i$ rather than values corresponding to one type of $max_i$. If the determination of S40 is negative (i.e., when it is determined that the magnetic material 40 is not present), this routine is terminated as in the first example described above. If the determination of S40 is affirmative (i.e., when it is determined that the magnetic material 40 is present), S50 and subsequent steps are executed. Basically, S50 and the subsequent steps are the same as the first example; however, $max_i$ used at S50 and the subsequent steps is $max_i$ corresponding to the absolute value of the evaluation value $B_k$ when it is determined that the magnetic material 40 is present.

As described above, according to this example, the time change amounts $A_{Qk}$ of the output values $Q_{kj}$ of the two magnetic sensors in time intervals of the same length starting from the same time point are respectively calculated for each of multiple time intervals having different lengths, and the magnetic material 40 is detected by using the time change amounts $A_{Qk}$ in the time intervals of the same length, so that the time change amounts $A_{Qk}$ are properly calculated according to a difference in the operation speed during operation of the magnetic material detection device 10 by an operator, which enables a further improvement in the detection accuracy of the magnetic material 40.

Although the examples of the present invention have been described in detail with reference to the drawings, the present invention is also applicable in other forms.

Figure 12:
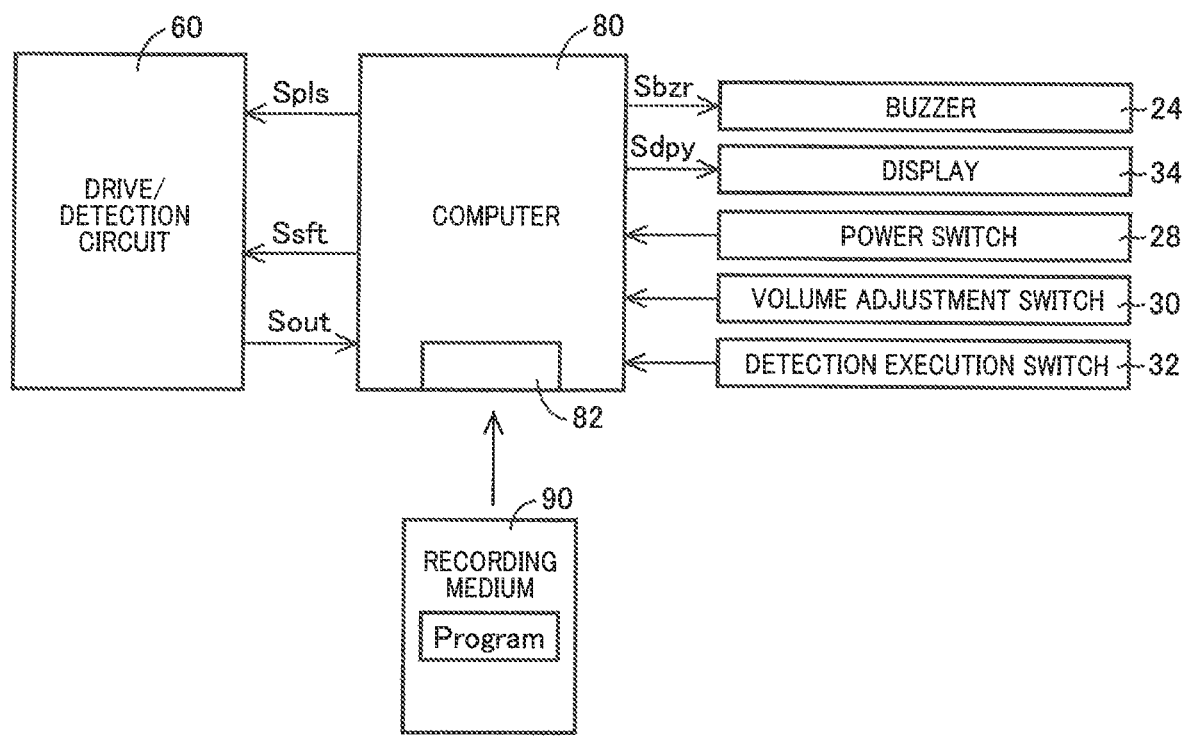
FIG. 12 is a diagram of an example of a computer-readable recording medium to which the present invention is applied and in which a program for driving a computer to implement a magnetic material detection function is recorded.

For example, the present invention may also be applied to a computer-readable recording medium 90 recording a program Program for causing a computer 80 to which the drive/detection circuit 60 etc. are connected as shown in FIG. 12 to implement a magnetic material detection function of detecting the presence/absence of the magnetic material 40 by using the time change amounts $A_{Qk}$ of the output values $Q_{kj}$ of two magnetic sensors similar to that of the magnetic material detection device 10 (i.e., a magnetic material detection function corresponding to the magnetic material detecting portion 52 included in the control device 50). In FIG. 12, the computer 80 is configured to include, for example, a so-called microcomputer similar to the control device 50 including a CPU, a RAM, a ROM, an input/output interface, etc., and a reading device 82. The computer 80 can read the program Program recorded in advance in the recording medium 90 through the reading device 82 to execute the program Program. Therefore, the present invention may also be applied to the computer-readable recording medium 90 recording the program Program for causing the computer 80 to implement the magnetic material detection function corresponding to the magnetic material detecting portion 52 included in the control device 50. The same effects as the examples described above are obviously be obtained even in this way. The recording medium 90 is a medium capable of recording the program Program, such as an optical disk such as a CD or a DVD, a storage device such as a floppy disk or a hard disk drive, or a nonvolatile memory such as a flash memory. Various forms are available as a form of causing the computer 80 to implement the program Program, including a form in which the computer 80 downloads the program Program stored in a server (which is also a type of the recording medium 90) through a communication to execute the program Program. Therefore, the present invention may also be applied to the program Program for causing the computer 80 to implement the magnetic material detection function corresponding to the magnetic material detecting portion 52 included in the control device 50. The same effects as the examples described above are obviously be obtained even in this way.

In the examples described above, the magnetic material detection device 10 includes two pairs of two magnetic sensors having the same magnetically sensitive direction; however, the present invention is not limited to this form. For example, the magnetic material detection device 10 may include at least one of the pairs, i.e., the pair of the first magnetic sensor 14x and the third magnetic sensor 16x and the pair of the second magnetic sensor 14y and the fourth magnetic sensor 16y. The magnetic material detection device 10 may include two scalar-type magnetic sensors such as those detecting an absolute value of a magnetic field, instead of the vector-type magnetic sensors. The present invention is applicable to the magnetic material detection device 10 as long as at least two magnetic sensors are included as described above.

In the examples described above, the presence/absence of the magnetic material 40 is detected by moving the magnetic material detection device 10 made close to a surface of the subject 38; however, the presence/absence of the magnetic material 40 may be detected by moving the subject 38.

In the examples described above, the cancellation of the magnetic material detection mode is determined by using the self-reset value $M_u$ in the measurement sensor portion 14; however, the present invention is not limited to this form. For example, the cancellation of the magnetic material detection mode may always be determined by using the self-reset value $M_a$ of the absolute value component in the measurement sensor portion 14. If this self-reset value $M_a$ is used, a maximum value $MAX_{Ma}$ of the self-reset value $M_a$ is updated as necessary, and whether the magnetic material detection mode is canceled is determined based on whether $M_a/MAX_{Ma}$ is less than a threshold value (the predetermined ratio Th). Alternatively, the cancellation of the magnetic material detection mode may be determined by using a difference $S_k$ ($=M_k-R_k$) between the self-reset value $M_k$ in the measurement sensor portion 14 and a self-reset value $R_k$ in the reference sensor portion 16. Alternatively, the cancellation of the magnetic material detection mode may be determined by combining the determination using the self-reset value $M_k$ and the determination using the difference $S_k$.

In the examples described above, the first to fourth magnetic sensors 14x, 14y, 16x, 16y are magnetic impedance sensors (MI sensors); however, other types of magnetic sensors may be used as long as the magnetic sensors are vector-type magnetic sensors having the magnetically sensitive direction in one direction.

The above description is merely an embodiment and the present invention can be implemented in variously modified and improved forms based on the knowledge of those skilled in the art.

REFERENCE SIGNS LIST

10: Magnetic material detection device
14: Measurement sensor portion (Magnetic sensor)
14x: First magnetic sensor (Vector-type magnetic sensor)
14y: Second magnetic sensor (Vector-type magnetic sensor)
16: Reference sensor portion (Magnetic sensor)
16x: Third magnetic sensor (Vector-type magnetic sensor)
16y: Fourth magnetic sensor (Vector-type magnetic sensor)
38: Subject
40: Magnetic material
50: Control device
80: Computer
90: Recording medium

The invention claimed is:

1. A magnetic material detection device comprising: at least two magnetic sensors; and a control device detecting a magnetic material by using output values of the magnetic sensors, wherein the magnetic sensors are arranged at an interval of a predetermined distance from each other such that a subject is located outside a space therebetween, and wherein the control device detects the magnetic material by comparing time change amounts of output values of the magnetic sensors resulting from a change in relative position between the subject and each of the magnetic sensors, with utilizing that an absolute value of the time change amount becomes larger in one of the magnetic sensors close to the subject as compared to another of the magnetic sensors far from the subject.

2. The magnetic material detection device according to claim 1, wherein the magnetic sensors are vector-type magnetic sensors having a magnetically sensitive direction and the magnetic material detection device includes two magnetic sensors having the same magnetically sensitive direction, and wherein the control device detects the magnetic material by using time change amounts of output values of the two magnetic sensors having the same magnetically sensitive direction.

3. The magnetic material detection device according to claim 1, wherein the control device detects the magnetic material by using a difference in time change amounts of output values of the magnetic sensors.

4. The magnetic material detection device according to claim 1, wherein
when the magnetic material is detected, the control device calculates a distance between the magnetic material and the magnetic sensors as well as a strength of a magnetic moment of the magnetic material by using output value change amounts from an immediately preceding timing of the magnetic sensors obtained by subtracting output values of the magnetic sensors acquired immediately before a first detection of the magnetic material from the latest output values of the magnetic sensors, respectively.

5. The magnetic material detection device according to claim 4, wherein when the magnetic material is detected, the control device determines whether the detected magnetic material has become more distant from the magnetic sensors based on whether a ratio of the output value change amount to a maximum value of the output value change amounts has become less than a predetermined ratio.

6. The magnetic material detection device according to claim 1, wherein
when the magnetic material is detected, the magnetic material detecting portion establishes a magnetic material detection mode, and
the control device cancels the magnetic material detection mode when a ratio of an output value change amount to a maximum value of the output value change amount from an immediately preceding timing in one of the magnetic sensors is less than a predetermined ratio, wherein the output value change amount from the immediately preceding timing is obtained by subtracting an output value of the magnetic sensor acquired immediately before a first detection of the magnetic material from the latest output value of the magnetic sensor during the magnetic material detection mode is established.

7. The magnetic material detection device according to claim 1, wherein
the control device calculates the time change amounts of the output values of the two magnetic sensors in time intervals of the same length starting from the same time point for each of multiple time intervals having different lengths respectively and detects the magnetic material by using the time change amounts in the time intervals of the same length.

8. The magnetic material detection device according to claim 2, wherein the control device detects the magnetic material by using a difference in time change amounts of output values of the magnetic sensors.

9. The magnetic material detection device according to claim 2, wherein
when the magnetic material is detected, the control device calculates a distance between the magnetic material and the magnetic sensors as well as a strength of a magnetic moment of the magnetic material by using output value change amounts from an immediately preceding timing of the magnetic sensors obtained by subtracting output values of the magnetic sensors acquired immediately before a first detection of the magnetic material from the latest output values of the magnetic sensors, respectively.

10. The magnetic material detection device according to claim 9, wherein when the magnetic material is detected, the control device determines whether the detected magnetic material has become more distant from the magnetic sensors based on whether a ratio of the output value change amount to a maximum value of the output value change amounts has become less than a predetermined ratio.

11. The magnetic material detection device according to claim 2, wherein
when the magnetic material is detected, the magnetic material detecting portion establishes a magnetic material detection mode, and
the control device cancels the magnetic material detection mode when a ratio of an output value change amount to a maximum value of the output value change amount from an immediately preceding timing in one of the magnetic sensors is less than a predetermined ratio, wherein the output value change amount from the immediately preceding timing is obtained by subtracting an output value of the magnetic sensor acquired immediately before a first detection of the magnetic material from the latest output value of the magnetic sensor during the magnetic material detection mode is established.

12. The magnetic material detection device according to claim 2, wherein
the control device calculates the time change amounts of the output values of the two magnetic sensors in time intervals of the same length starting from the same time point for each of multiple time intervals having different lengths respectively and detects the magnetic material by using the time change amounts in the time intervals of the same length.

* * * * *